US009619324B2

(12) United States Patent
Kwok et al.

(10) Patent No.: US 9,619,324 B2
(45) Date of Patent: Apr. 11, 2017

(54) ERROR CORRECTION IN NON_VOLATILE MEMORY

(71) Applicant: Intel Corporation, Santa Clara, CA (US)

(72) Inventors: Zion S. Kwok, Burnaby (CA); Ravi H. Motwani, San Diego, CA (US); Kiran Pangal, Fremont, CA (US); Prashant S. Damle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/126,310

(22) PCT Filed: Sep. 27, 2013

(86) PCT No.: PCT/US2013/062405
§ 371 (c)(1),
(2) Date: Dec. 13, 2013

(87) PCT Pub. No.: WO2015/047334
PCT Pub. Date: Apr. 2, 2015

(65) Prior Publication Data
US 2015/0220387 A1 Aug. 6, 2015

(51) Int. Cl.
*G06F 11/10* (2006.01)
*G06F 12/00* (2006.01)
(Continued)

(52) U.S. Cl.
CPC .......... *G06F 11/1068* (2013.01); *G06F 11/10* (2013.01); *G06F 11/1044* (2013.01);
(Continued)

(58) Field of Classification Search
CPC ...... G06F 11/1068; G06F 11/10; G06F 12/00; H03M 13/152; H03M 13/1515; G11C 29/52
(Continued)

(56) References Cited

U.S. PATENT DOCUMENTS 4,764,927 A  8/1988 Izumita et al.
5,455,939 A  10/1995 Rankin et al.
(Continued)

FOREIGN PATENT DOCUMENTS

EP  0 579 131 A2  1/1994
WO  2013/089715 A1  6/2013
WO  2013089715 A1  6/2013

OTHER PUBLICATIONS

"Models and Algorithmic Limits for an ECC-Based Approach to Hardening Sub-100-nm SRAMs" Michael A. Bajura,et al IEEE Transactions on Nuclear Science, vol. 54, No. 4, Aug. 2007.*
(Continued)

*Primary Examiner* — Cynthia Britt
(74) *Attorney, Agent, or Firm* — Todd A. Alder; Thorpe North & Western, LLP

(57) ABSTRACT

Apparatus, systems, and methods for error correction in memory are described. In one embodiment, a memory controller comprises logic to receive a read request for data stored in a memory, retrieve the data and at least one associated error correction codeword, wherein the data and an associated error correction codeword is distributed across a plurality of memory devices in memory, apply a first error correction routine to decode the error correction codeword retrieved with the data and in response to an uncorrectable error in the error correction codeword, apply a second error correction routine to the plurality of devices in memory. Other embodiments are also disclosed and claimed.

25 Claims, 11 Drawing Sheets

(51) Int. Cl.
   *G11C 29/52*   (2006.01)
   *H03M 13/15*   (2006.01)
(52) U.S. Cl.
   CPC .............. *G06F 12/00* (2013.01); *G11C 29/52* (2013.01); *H03M 13/152* (2013.01); *H03M 13/1515* (2013.01); *G06F 2212/7207* (2013.01)
(58) Field of Classification Search
   USPC ........................................................ 714/758
   See application file for complete search history.

(56) References Cited

U.S. PATENT DOCUMENTS

| | | | |
|---|---|---|---|
| 5,754,753 A | 5/1998 | Smelser | |
| 5,996,105 A | 11/1999 | Zook | |
| 6,662,333 B1* | 12/2003 | Zhang | G06F 11/1044 714/767 |
| 6,948,091 B2* | 9/2005 | Bartels | H04L 1/22 714/11 |
| 7,304,893 B1 | 12/2007 | Hemink | |
| 7,355,892 B2 | 4/2008 | Hemink | |
| 7,676,730 B2 | 3/2010 | Haugan et al. | |
| 7,941,696 B2* | 5/2011 | Frost | G06F 11/1068 714/6.2 |
| 8,281,217 B2 | 10/2012 | Kim et al. | |
| 8,347,152 B2 | 1/2013 | Zheng et al. | |
| 8,572,457 B2* | 10/2013 | Rub | G06F 11/1012 714/755 |
| 8,607,124 B2* | 12/2013 | Weingarten | G06F 11/1048 365/185.09 |
| 8,812,915 B2* | 8/2014 | Warnes | G06F 11/1008 714/47.2 |
| 8,949,698 B2* | 2/2015 | Kwok | H03M 13/2909 714/767 |
| 9,021,337 B1* | 4/2015 | Northcott | G06F 11/1068 714/773 |
| 9,092,349 B2* | 7/2015 | Schmidt | G06F 11/1044 |
| 9,164,834 B2* | 10/2015 | Chung | G06F 11/085 |
| 9,176,810 B2* | 11/2015 | Peterson | G06F 11/10 |
| 9,218,852 B2* | 12/2015 | D'Abreu | G06F 13/1668 |
| 9,292,382 B2* | 3/2016 | Larsen | G11C 29/52 |
| 2005/0149819 A1 | 7/2005 | Hwang | |
| 2005/0154943 A1* | 7/2005 | Alexander | G11C 29/42 714/718 |
| 2006/0256615 A1 | 11/2006 | Larson | |
| 2007/0143659 A1 | 6/2007 | Ball | |
| 2008/0155376 A1 | 6/2008 | Williams et al. | |
| 2009/0164867 A1* | 6/2009 | Gray | H03M 13/13 714/758 |
| 2010/0223530 A1 | 9/2010 | Son et al. | |
| 2010/0269017 A1 | 10/2010 | Bueb | |
| 2011/0010603 A1 | 1/2011 | Yang | |
| 2011/0185254 A1 | 7/2011 | Radke et al. | |
| 2011/0209028 A1 | 8/2011 | Post et al. | |
| 2011/0239088 A1 | 9/2011 | Post et al. | |
| 2012/0198309 A1* | 8/2012 | Alves | G06F 11/10 714/763 |
| 2012/0203951 A1* | 8/2012 | Wood | G11C 16/28 711/102 |
| 2012/0221920 A1 | 8/2012 | Blaum et al. | |
| 2012/0304039 A1* | 11/2012 | Peterson | G06F 11/10 714/773 |
| 2012/0331367 A1 | 12/2012 | Blaum et al. | |
| 2013/0179753 A1* | 7/2013 | Flynn | G06F 12/0253 714/773 |
| 2013/0205183 A1* | 8/2013 | Fillingim | G06F 11/1044 714/773 |
| 2013/0282953 A1* | 10/2013 | Orme | G06F 12/0238 711/102 |
| 2014/0089758 A1 | 3/2014 | Kwok et al. | |
| 2014/0089760 A1 | 3/2014 | Schmidt et al. | |
| 2014/0129896 A1* | 5/2014 | Parthasarathy | H03M 13/1108 714/755 |
| 2014/0258804 A1* | 9/2014 | Pangal | G06F 11/1048 714/752 |
| 2015/0193300 A1* | 7/2015 | Shalvi | G06F 11/14 714/768 |
| 2015/0220387 A1* | 8/2015 | Kwok | G06F 12/00 714/764 |

OTHER PUBLICATIONS

International Search Report and Written Opinion received for PCT Patent Application No. PCT/US2011/065006, mailed Aug. 24, 2012, 7 pages.
Office Action received for U.S. Appl. No. 13/629,295, mailed on Jun. 4, 2014, 21 pages.
International Preliminary Report on Patentability and Written Opinion received for PCT Patent Application No. PCT/US2011/065006, mailed on Jun. 26, 2014, 6 pages.
International Search Report and Written Opinion received for PCT Patent Application No. PCT/US2013/062405, mailed on Jun. 25, 2014, 11 pages.

\* cited by examiner

ERROR CORRECTION IN NON_VOLATILE MEMORY

TECHNICAL FIELD

The present disclosure generally relates to the field of electronics. More particularly, some embodiments of the invention generally relate to error correction in non-volatile memory for electronic devices.

BACKGROUND

Many electronic devices include memory systems that may be implemented using local, fast-access memory which is frequently embodied as a nonvolatile memory, e.g., flash memory or the like. The memory may include multiple memory devices, and data may be distributed across the multiple memory devices. Periodically, read errors may occur due to errors in the storage media (non-volatile memory) and/or errors in signal processing. Accordingly, techniques to manage error correction in memory may find utility, e.g., in memory systems for electronic devices.

BRIEF DESCRIPTION OF THE DRAWINGS

The detailed description is provided with reference to the accompanying figures. The use of the same reference numbers in different figures indicates similar or identical items.

DESCRIPTION OF EMBODIMENTS

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
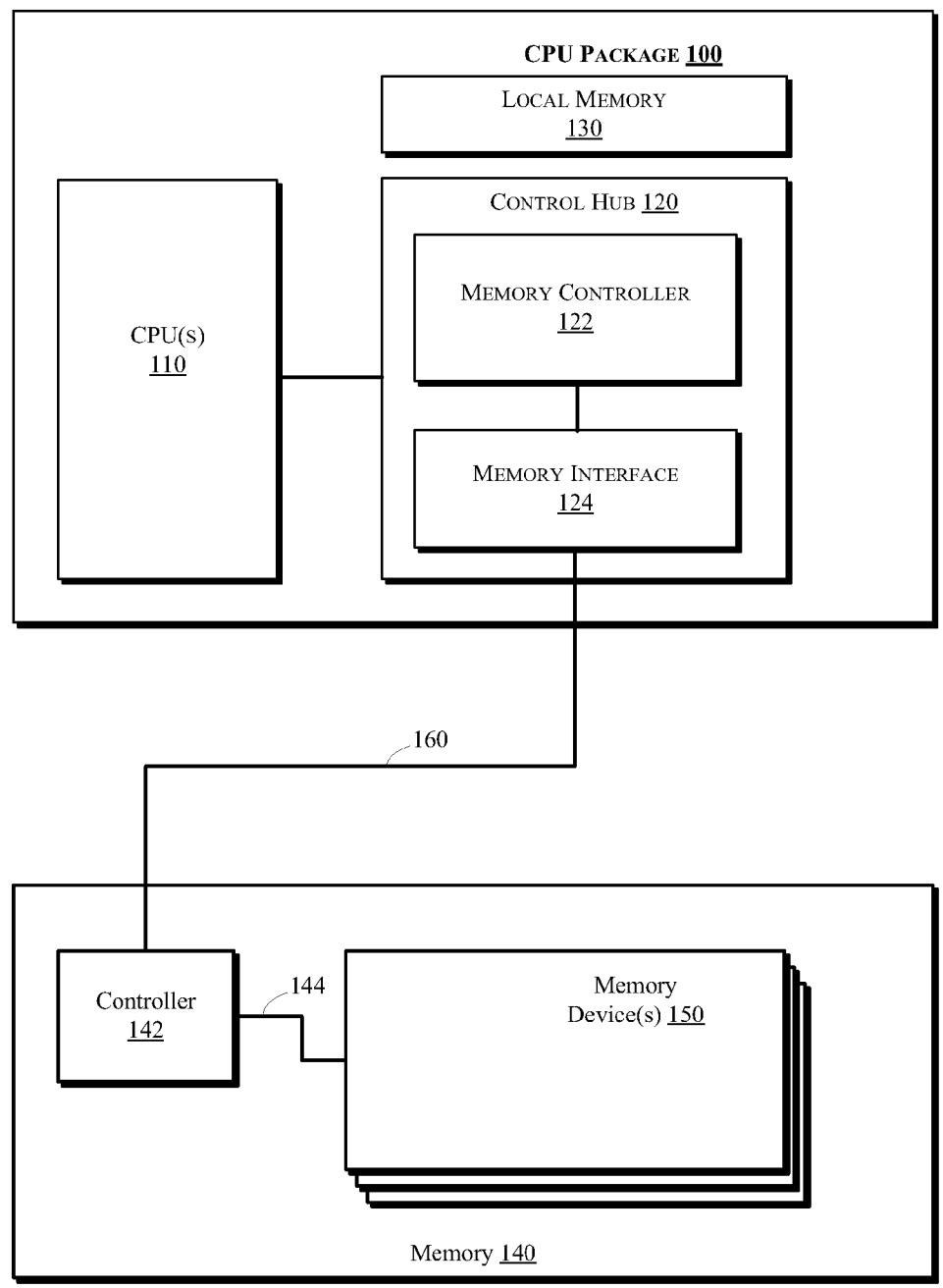
FIG. 1 is a schematic, block diagram illustration of components of apparatus to implement error correction in memory in accordance with various examples discussed herein.

FIG. 1 is a schematic, block diagram illustration of components of apparatus to implement error correction in memory in accordance with various examples discussed herein. Referring to FIG. 1, in some embodiments a central processing unit (CPU) package 100 which may comprise one or more CPUs 110 coupled to a control hub 120 and a local memory 130. Control hub 120 comprises a memory controller 122 and a memory interface 124.

Memory interface 124 is coupled to a remote memory 140 by a communication bus 160. In some examples, the communication bus 160 may be implemented as traces on a printed circuit board, a cable with copper wires, a fibre optic cable, a connecting socket, or a combination of the above. Memory 140 may comprise a controller 142 and one or more memory device(s) 150. In various embodiments, at least some of the memory banks 150 may be implemented using volatile memory, e.g., static random access memory (SRAM), a dynamic random access memory (DRAM), nonvolatile memory, or non-volatile memory, e.g., phase change memory, NAND (flash) memory, ferroelectric random-access memory (FeRAM), nanowire-based non-volatile memory, memory that incorporates memristor technology, three dimensional (3D) cross point memory such as phase change memory (PCM), spin-transfer torque memory (STT-RAM) or NAND flash memory. By way of example, in some embodiments the memory device(s) 140 may comprise one or more direct in-line memory modules (DIMMs) coupled to a memory channel 144 which provides a communication link to controller 142. The specific configuration of the memory device(s) 150 in the memory 140 is not critical.

As described above, in some embodiments logic in the memory controller 122 implements error correction in memory 140. More particularly, in some embodiments the memory controller 122 implements error correction operations using error correction codes which have been distributed across multiple memory devices 150 in memory 140.

Figure 2A:
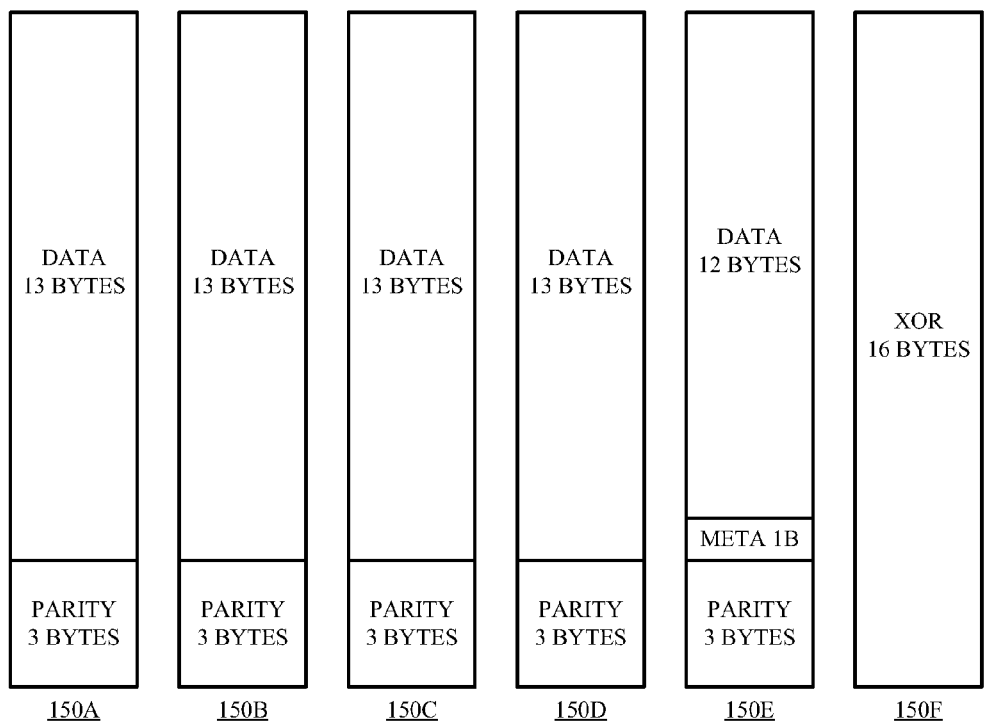
FIGS. 2A-2D and 4 are schematic illustrations of memory in accordance with various embodiments discussed herein.

FIGS. 2A-2D are schematic illustrations of memory 140 in accordance with various embodiments discussed herein. Referring first to FIG. 2A, memory 140 may comprise a plurality of memory devices (e.g., DIMMs) 150A, 150B, 150C, 150D, 150E, 150F, which may be referred to collectively herein by reference numeral 150. For example the memory devices 150 may each comprise 16 bytes of storage. Five of the memory devices (150A-150E) may be used to store data, while the sixth memory device (150F) may be used to store the bitwise XOR of the data stored in devices 150A-150E.

An error correcting codeword such as a Bose-Chaudhuri-Hocquenghem (BCH) codeword is distributed across memory devices 150A-150E by storing a portion of the codeword in each of the respective devices. In the example depicted in FIG. 2A the BCH codeword is a 15 byte codeword distributed across five memory devices 15A-150E. By removing the need for ECC protection of the memory device 150F which is used for XOR, the BCH codeword for the data can grow to be one large codeword occupying the remaining 5 memory devices 150A-150E.

Figure 2B:
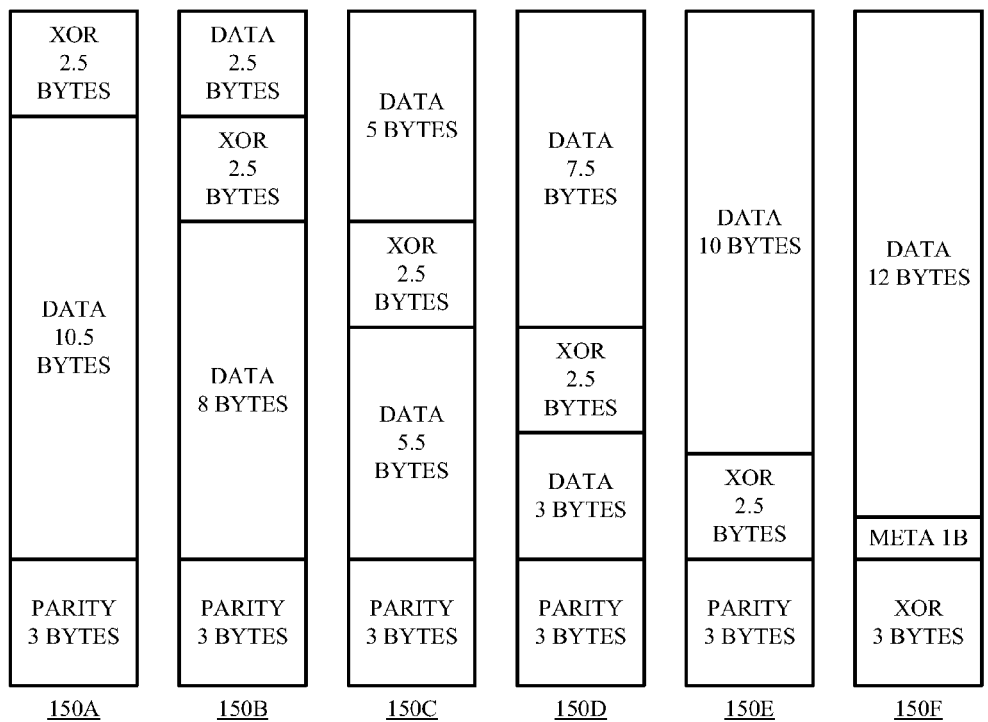

FIG. 2B is a schematic illustration of a memory 140 in which the XOR is distributed across all 6 memory devices 150A-150F. The XOR functions in the same way as a raw bit-wise XOR across all 6 devices 150A-150F. Thus, when a device fails, ⅙ of the contents of the device do not need to be recovered with errors from other devices because ⅙ of the contents contains XOR data that is not part of the BCH codeword.

Figure 2C:
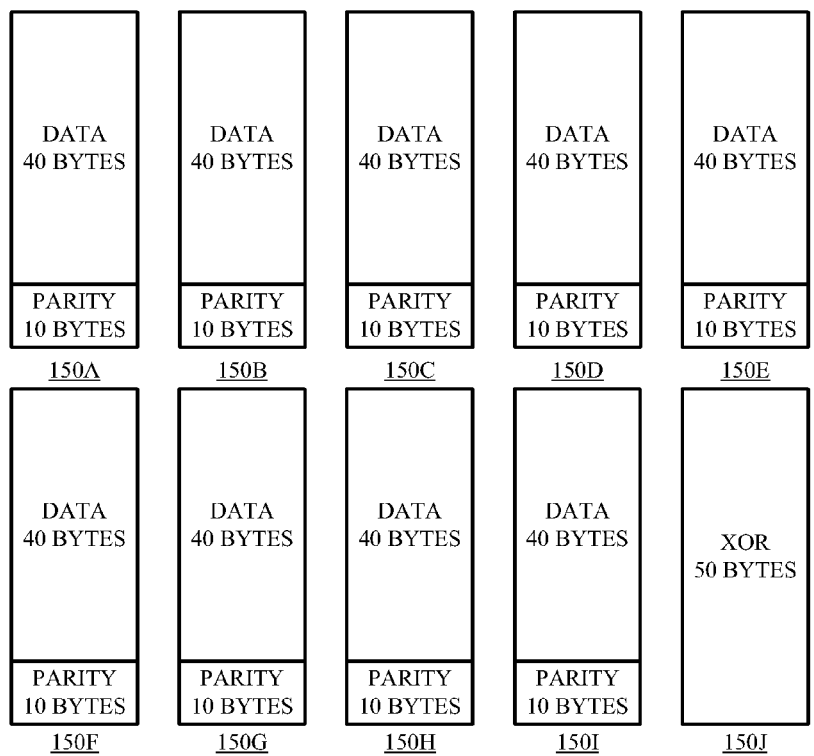

The particular size and number of memory devices 150 is not critical. The error correction codeword can be a different type of ECC code, not just BCH. Similarly. FIG. 2C illustrates an example in which the memory 140 comprises ten memory devices 150A-150J, each of which stores 50 bytes. The first nine devices 150A-150I store data and the low-density parity-check (LDPC) codeword is distributed across the nine devices 150A-150I. The tenth device 150J is used to store the XOR.

By way of overview, when the LDPC codeword fails to decode during a read operation because there are too many errors, it is either because there are simply too many random errors, or because one of the memory devices 150 is nonfunctional. Because the LDPC codeword spans/is distributed across all of the memory devices 150 which store data it is not known which of the memory devices 150 has the higher bit error rate and needs recovery. To accommodate this uncertainty the contents of each of the memory devices 150 can be recovered in turn, testing the possibility that each of the memory devices 150 failed individually. Recovery of the memory device 150 mostly likely to have the most errors based on historical data may be attempted first.

Figure 2D:
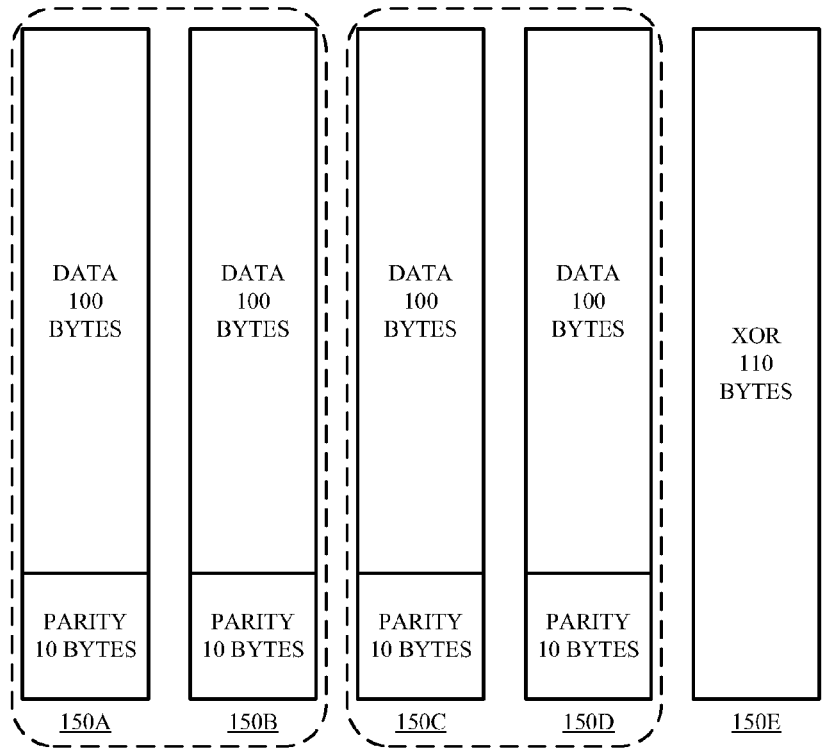

There may be a plurality of ECC codewords, and the ECC codes may be different, but the XOR is always smaller than the largest ECC codeword. FIG. 2D illustrates an example in which the memory 140 comprises five memory devices 150A-150E, each of which stores 110 bytes. There are two BCH codewords, one spread/distributed across two devices 150A-150B and the other spread/distributed across two devices 150C-150D. The fifth device 150E is used to store XOR.

By way of overview, when there is a failure to decode one or both of the BCH codewords in FIG. 2D fail during a read operation because there are too many errors, it is either because there are simply too many random errors, or because one of the memory devices 150 is nonfunctional. Because both BCH codewords spans more than one memory device 150 which hold data it is not known which of the memory devices 150 has the higher bit error rate and needs recovery. To accommodate this uncertainty the contents of each of the memory devices 150 that store data belonging to the uncorrectable codeword(s) can be recovered in turn, testing the possibility that each of the memory devices 150 failed individually. Recovery of the memory device 150 mostly likely to have the most errors based on historical data may be attempted first.

Figure 3:
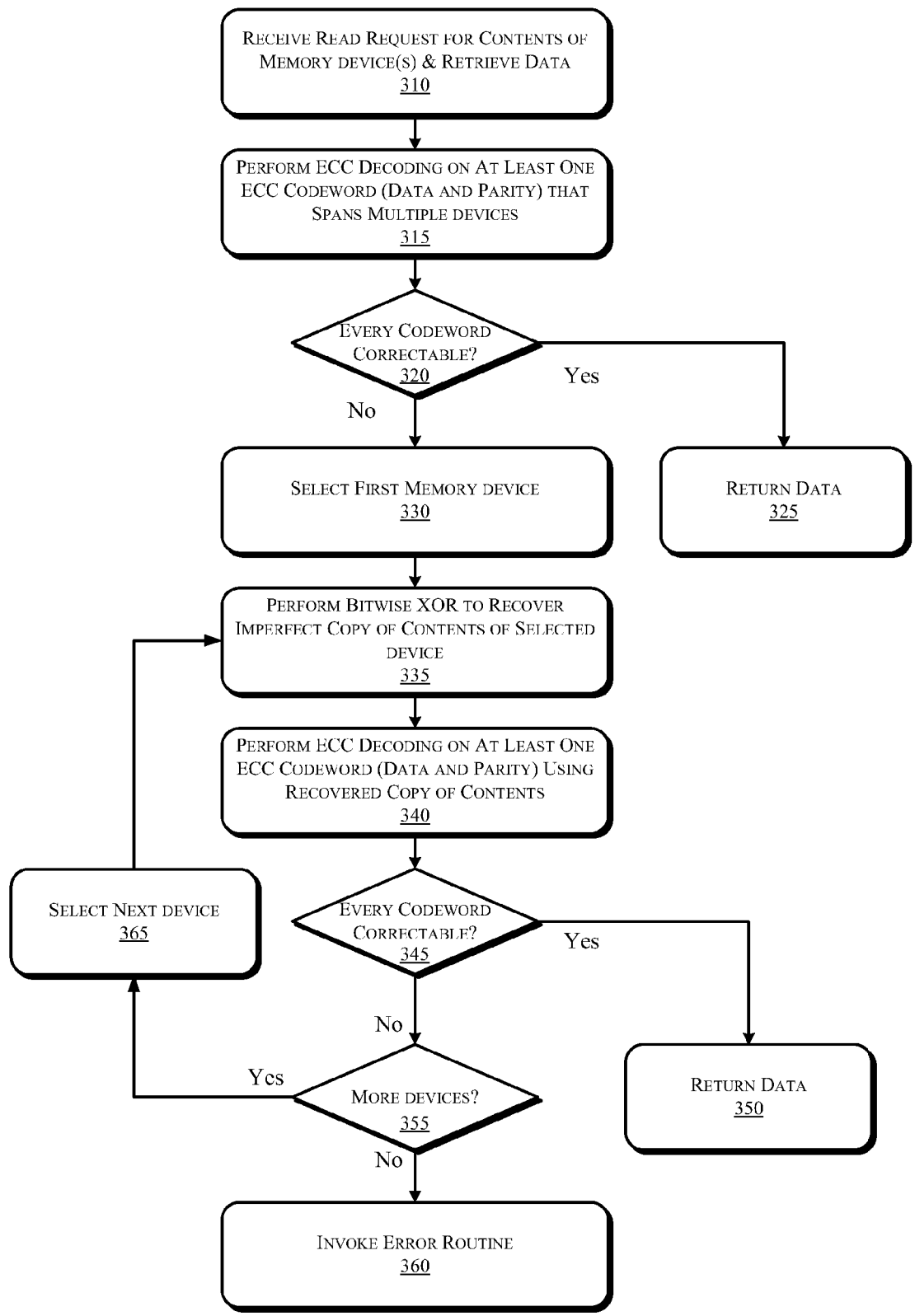
FIGS. 3 and 5 flowcharts illustrating operations in a method to implement error correction in memory accordance with various embodiments discussed herein.

FIG. 3 is a flowchart illustrating operations in a method to implement error correction in memory in accordance with various embodiments discussed herein. In some embodiments the operations depicted in FIG. 3 may be implemented as logic which may be executed by a memory controller 122 or by a controller 142 local to the memory 140.

Referring to FIG. 3, at operation 310 a read request for data stored in a memory 140 is received and the data and an associated error correction codeword is retrieved from the memory 140. As described above with reference to FIGS. 2A-2D, in some examples the data and at least one associated error correction codeword is spread/distributed across a plurality of memory devices 150 in memory 140.

At operation 315 an error correction code decoding is performed on the error correction codeword(s) retrieved in operation 310. For example, the error correction codeword may be a Bose-Chaudhuri-Hocquenghem (BCH) error correction code, a Reed-Solomon code, a low-density parity check (LDPC) code, a turbo code, a convolutional code, or a polar code. During the read operation one or more read errors or faults in the memory device(s) 150 may cause an error in the error correction codeword(s). If, at operation 320, every codeword is correctable then the data can be read successfully and returned (operation 325) in response to the read operation.

By contrast, if at operation 320 at least one codeword is not correctable then operations are implemented to apply a second error correction routine to test the individual memory devices 150. For example, in the example depicted in FIG. 2A the individual memory device 150A-150E may be tested.

Accordingly, at operation 330 a first memory device 150 (e.g., 150A) is selected. At operation 335 a bitwise XOR is performed on some or all of the remaining devices (e.g., 150B-150E) to recover the contents of device 150A.

At operation 340 the error correction code decoding performed in operation 315 is repeated using the recovered copy of the contents from the selected memory device (e.g., 150A). If, at operation 345, every codeword is correctable then the data can be read successfully and returned (operation 350) in response to the read operation.

By contrast, if at operation 345 at least one codeword is not correctable then control passes to operation 355. Operation 355 checks for any memory devices 150 that have not been tested yet. In some examples, operation 355 may limit the check to any memory devices 150 that have not been tested yet that store data belonging to an uncorrectable codeword. If at operation 355 there are no more memory devices 150 to test then control passes to operation 360 and an error routine is invoked in response to the read command. For example, the error routine may comprise returning a read error message to a host device.

By contrast, if at operation 355 there are more memory devices 150 to test then control passes to operation 365 and the next memory device (e.g., 150B) is selected. Control then passes back to operation 335 and a bitwise XOR operation is performed to recover a copy of the contents of the selected memory device (e.g., 150B).

Thus, operations 335-365 define a logical loop pursuant to which some or all of the memory devices 150 are sequentially tested to determine whether the read error can be corrected by ECC decoding one or more of the memory devices 150.

In another example the memory device(s) 150 may include Reed-Solomon (RS) error correction codes rather than BCH error correction codes. Although RS codes are not as efficient as BCH codes for random errors, RS codes are just as strong as XOR for erasure decoding. One bit of RS parity can recover one bit of erased data, just as one bit of XOR parity can recover one bit of erased data. So the RS code can match XOR's efficiency in terms of fewest parity bits for chip failure recovery, but is less efficient than BCH.

Figure 4:
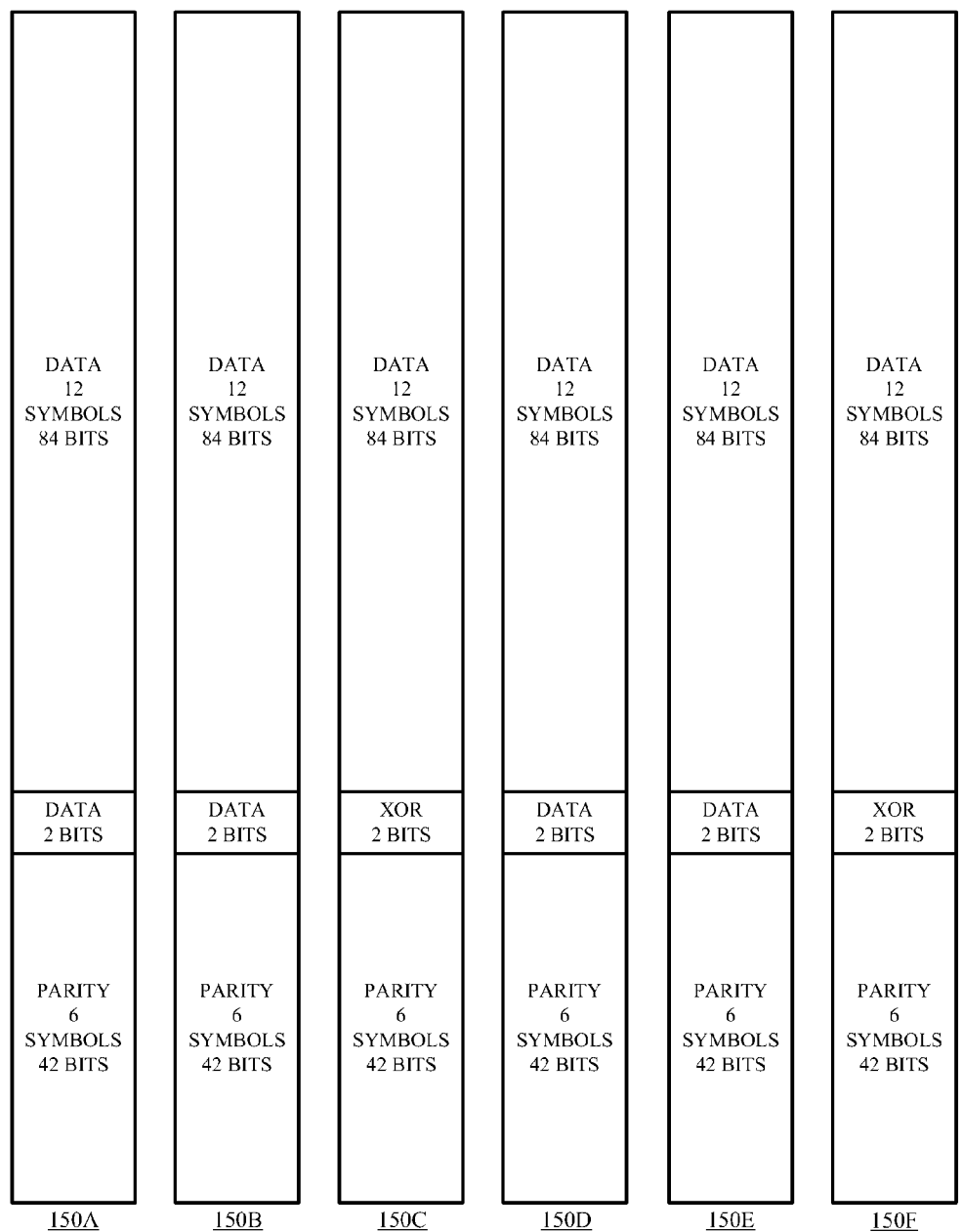

FIG. 4 are schematic illustrations of memory 140 in accordance with various embodiments discussed herein. FIG. 4 shows an example configuration in which the memory device(s) 150 store a codeword with 64 bytes of data and some associated metadata and parity. This example RS code has 7-bit symbols and can correct 18 symbol errors. During XOR recovery, this correction capability is split between correcting 9 errors and decoding 18 symbol erasures. Each memory device has 18 symbols and 2 extra bits. The 2 extra bits may be protected against memory device failure using the 2 bits of XOR. Each 2 bits of XOR protect 4 data bits in 2 memory devices 150, and are only used in case of memory device failure. For the purpose of Reed-Solomon encoding and decoding, each of the 4 data bits and 2 XOR bits are treated as one 7-bit data symbol comprising 4 data bits, 2 XOR bits, and 1 pad bit. The XOR bits are not necessary, but may be added to reduce the number of symbols that need to be marked as erased. The only necessary rule for the arrangement of symbols is that the symbols are, for the most part, contained in the same memory device 150, and do not have bits distributed across several memory devices 150. This is important for erasing a chip as 18 symbol erasures to work.

The RS code in such a configuration with 64 bytes of data and 32 bytes of parity can use all 32 bytes of parity, instead of splitting half of the 32 bytes with XOR, the RS code has 32 bytes of parity versus the 16 bytes of parity of BCH. So even if the RS code was 1.5× less efficient for correcting random bit errors, having twice the amount of parity, the RS code is now requires 0.75× the parity for the same correction strength as BCH, and therefore has the strength of a BCH code with 30% more parity.

Figure 5:
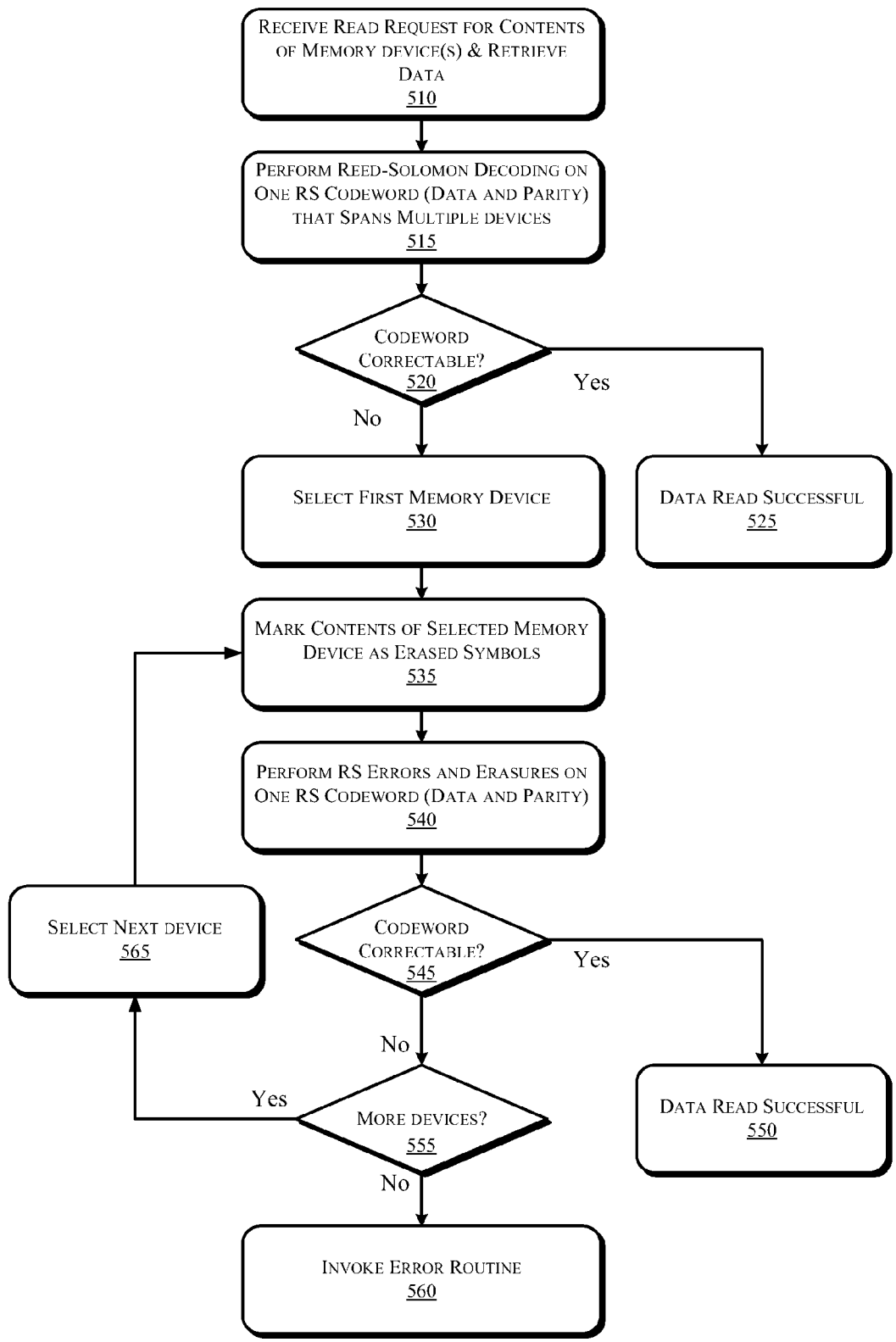

FIG. 5 is a flowchart illustrating operations in a method to implement error correction in memory using an RS code in accordance with various embodiments discussed herein. In some embodiments the operations depicted in FIG. 5 may be implemented as logic which may be executed by a memory controller 122 or by a controller 142 local to the memory 140.

Referring to FIG. 5, at operation 510 a read request for data stored in a memory 140 is received and the data the data and an associated error correction codeword is retrieved from the memory 140. As described above with reference to FIG. 4, in some examples the data and an associated error correction codeword is distributed across a plurality of memory devices 150 in memory 140.

At operation 515 an error correction code decoding is performed on the error correction codeword retrieved in operation 510. For example, the error correction codeword may be a Reed-Solomon (RS) error correction code. During the read operation one or more read errors or faults in the memory device(s) 150 may cause an error in the RS error code. If, at operation 520, the codeword is correctable then the data can be read successfully and returned (operation 525) in response to the read operation.

By contrast, if at operation 520 the codeword is not correctable then operations are implemented to apply a second error correction routine to test the individual memory device(s) 150. For example, in the example depicted in FIG. 4 the individual memory device 150A-150F may be tested. Accordingly, at operation 535 the contents of the selected memory device (e.g., 150A) are marked as erased symbols.

At operation 540 RS error and erasure coding on the codeword retrieved in operation 515 is repeated using the recovered copy of the contents from the selected memory device (e.g., 150A). If, at operation 545, the codeword is correctable then the data can be read successfully and returned (operation 550) in response to the read operation.

By contrast, if at operation 545 the codeword is not correctable then control passes to operation 555. If at operation 555 there are no more memory devices 150 to test than control passes to operation 560 and an error routine is invoked in response to the read command. For example, the error routine may comprise returning a read error message to a host device.

By contrast, if at operation 555 there are more memory devices 150 to test than control passes to operation 565 and the next memory device (e.g., 150B) is selected. Control then passes back to operation 535 and the contents of the selected memory device (e.g., 150A) are marked as erased symbols.

Thus, operations 535-565 define a logical loop pursuant to which the memory devices 150 are sequentially tested to determine whether the read error can be corrected by RS error correction decoding one or more of the memory devices 150.

Figure 6:
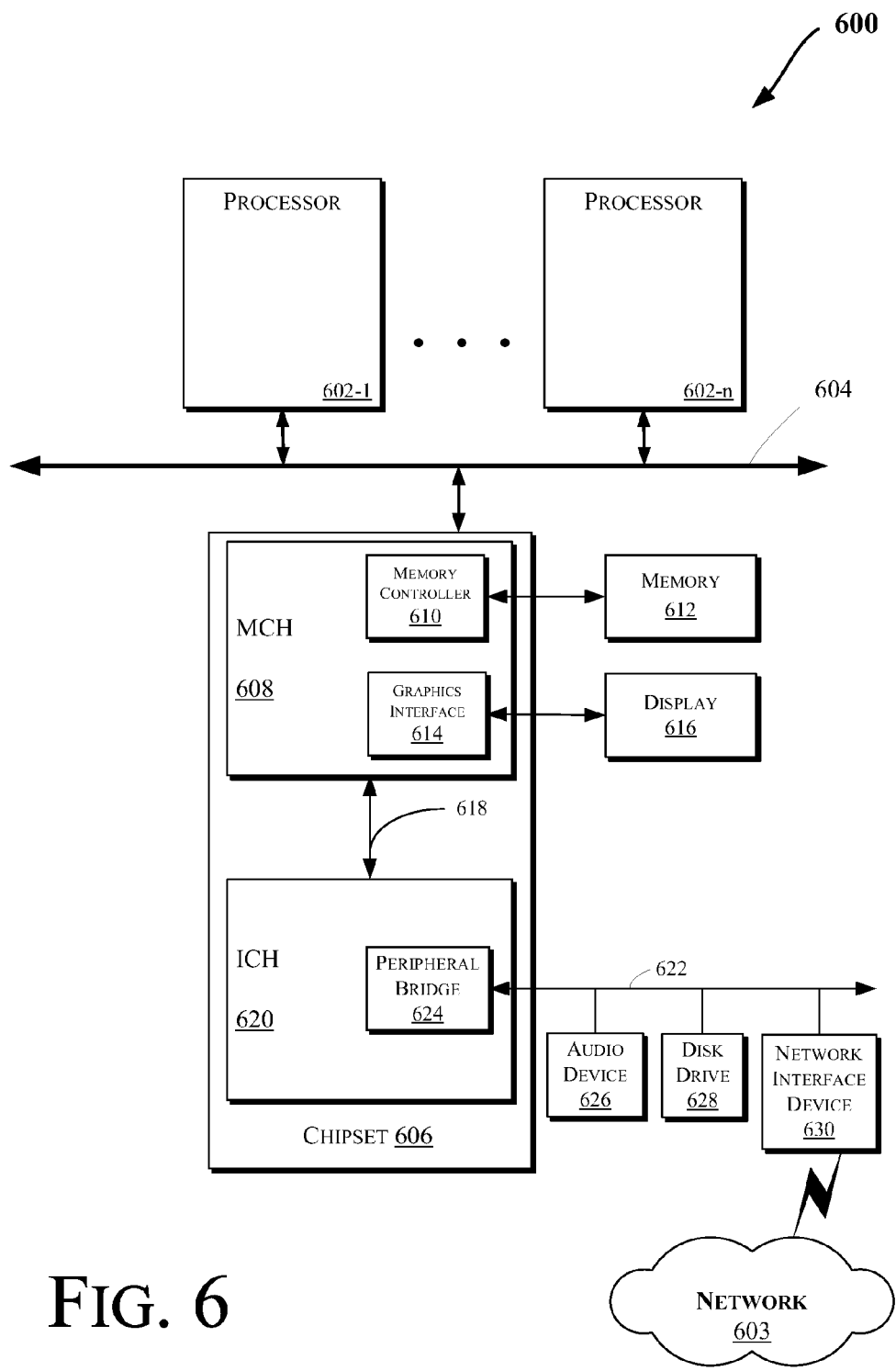
FIGS. 6-10 are schematic, block diagram illustrations of electronic devices which may be adapted to implement memory latency management in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
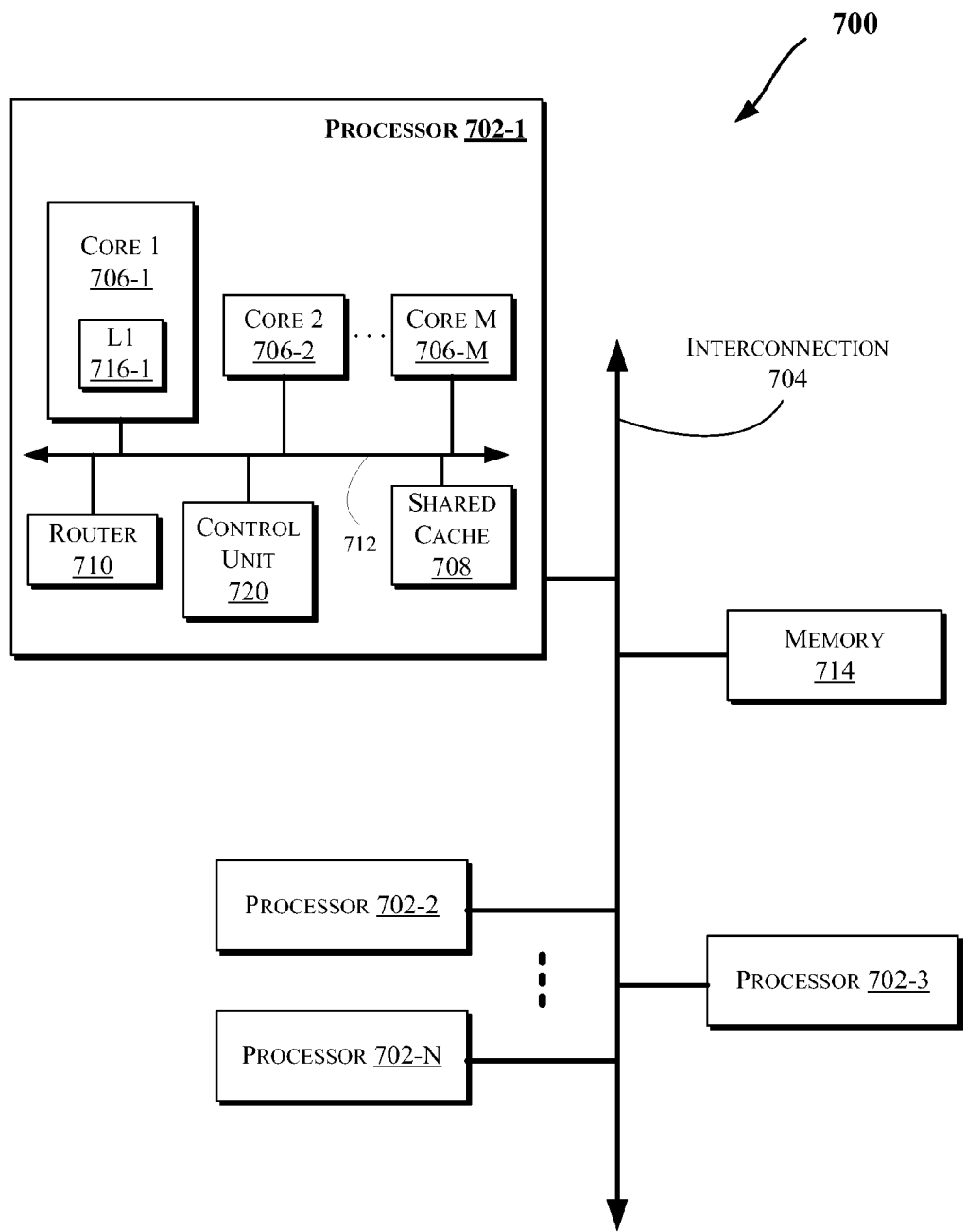

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
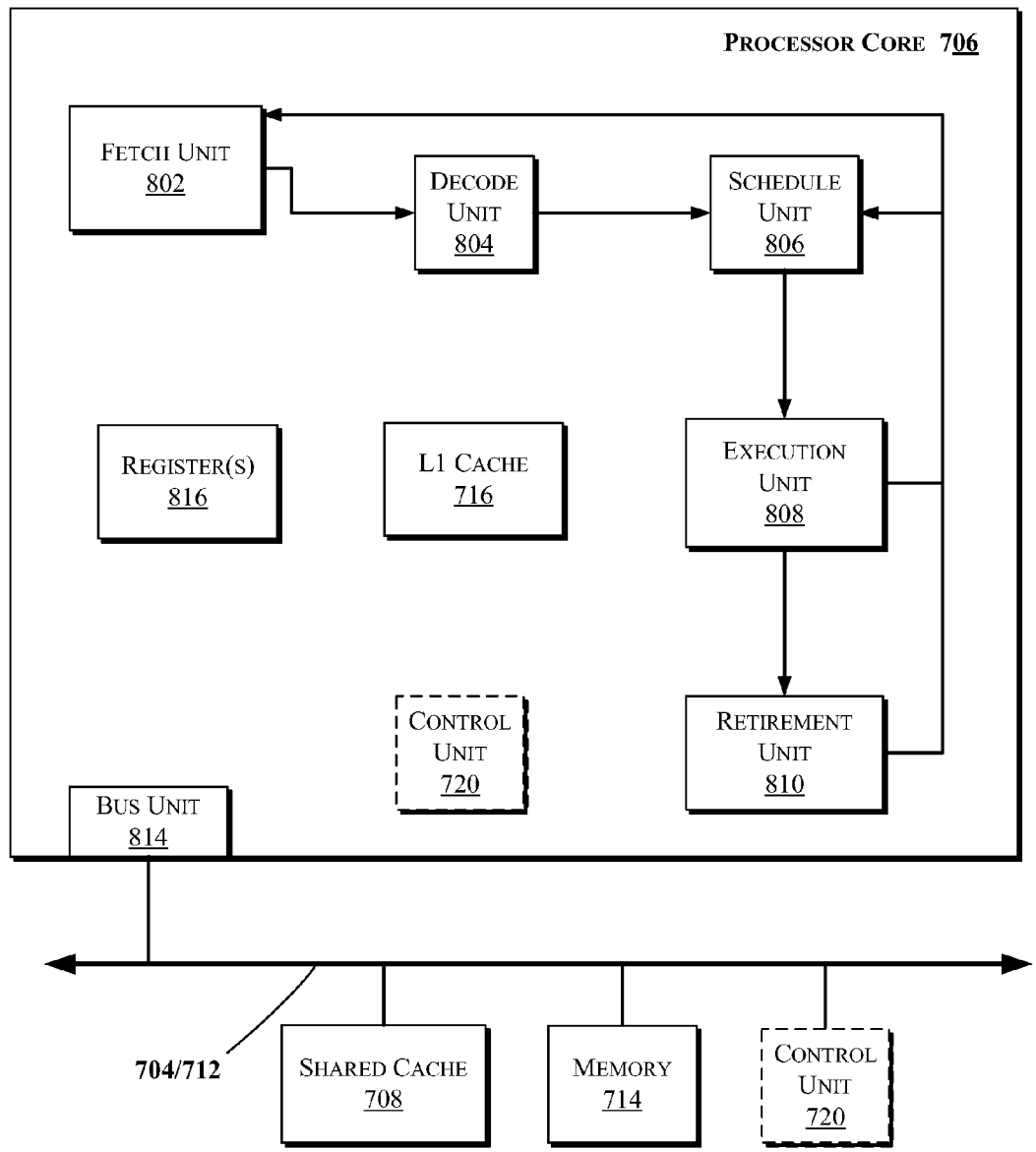

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch. e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
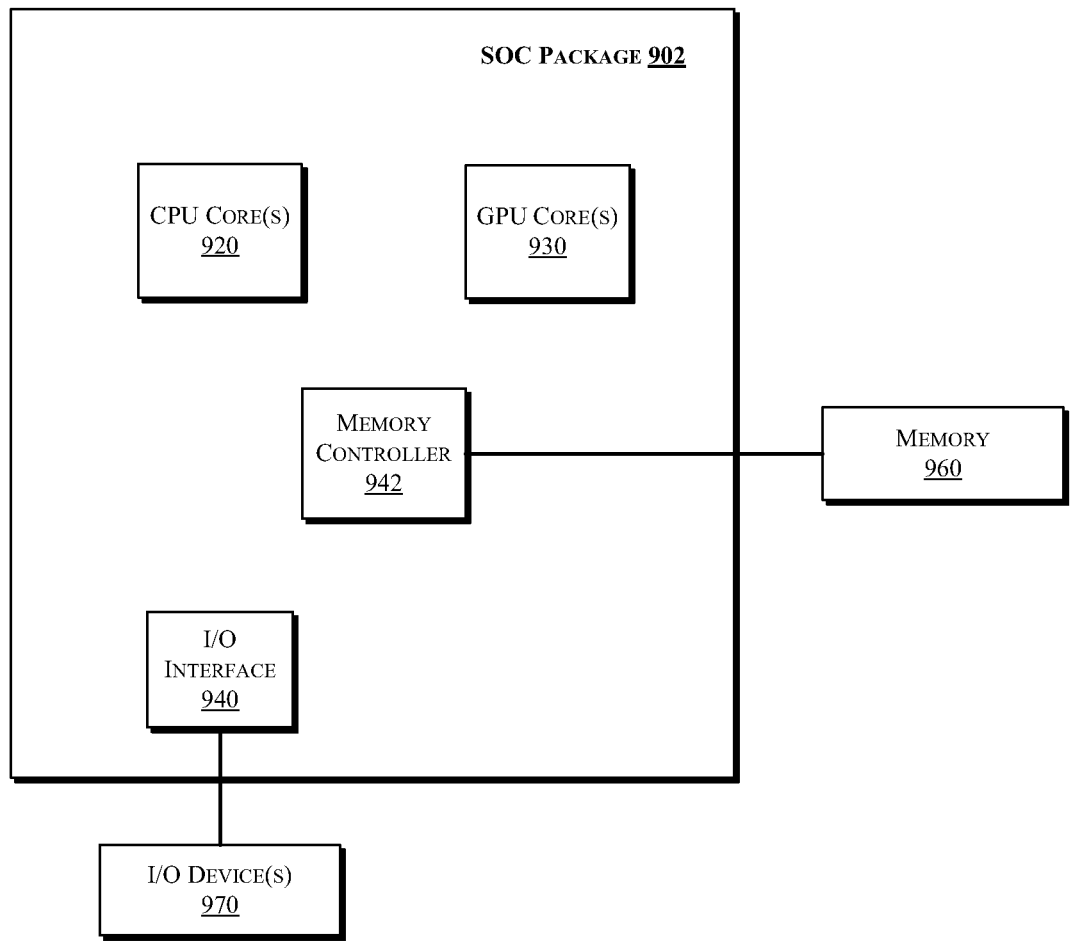

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (IO) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device (s) 970 may include one or more of a keyboard, a mouse, a touchpad, a display, an image/video capture device (such as a camera or camcorder/video recorder), a touch screen, a speaker, or the like.

Figure 10:
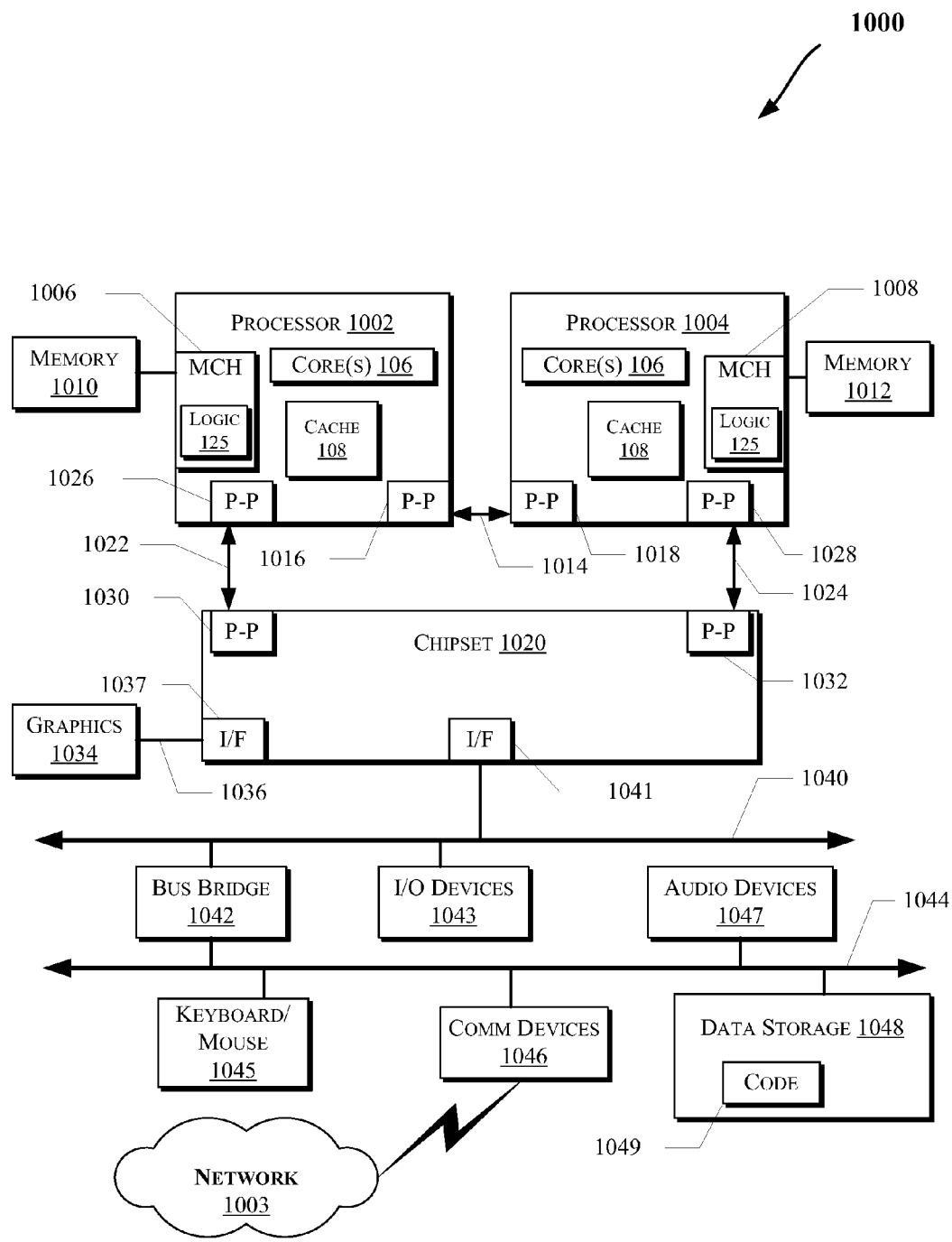

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 10134 via a high-performance graphics interface 1036, e.g., using a PtP interface circuit 1037.

As shown in FIG. 10, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

The following examples pertain to further embodiments.

Example 1 is a memory controller comprising logic to receive a read request for data stored in a memory, retrieve the data and an associated error correction codeword, wherein the data and at least one associated error correction codeword is distributed across a plurality of memory devices in memory, apply a first error correction routine to decode the error correction codeword retrieved with the data and in response to an uncorrectable error in the error correction codeword, apply a second error correction routine to the plurality of devices in memory.

In Example 2, the subject matter of Example 1 can optionally include an arrangement in which the error correction codeword is a Bose-Chaudhuri-Hocquenghem (BCH) error correction code, and at least one memory device comprises a bitwise XOR of the contents of the plurality of memory devices.

In Example 3, the subject matter of any one of Examples 1-2 can optionally include an arrangement in which the second error correction routine comprises logic to sequentially select a memory device, perform a bitwise XOR operation to recover a copy of the contents of the selected memory device, perform an error correction routine on the error correction codeword using the copy of the contents of the selected memory device.

In Example 4, the subject matter of any one of Examples 1-3 can optionally include logic to return the data in response to a successful recovery of the error correction codeword using the copy of the contents of a selected memory device.

In Example 5, the subject matter of any one of Examples 1-4 can optionally include logic to return an error in response to an unsuccessful recovery of the error correction codeword using the copy of the contents of the selected memory devices.

In Example 6, the subject matter of any one of Examples 1-5 can optionally include an arrangement in which the error correction codeword is a Reed-Solomon (RS) error correction code.

In Example 7, the subject matter of any one of Examples 1-6 can optionally include logic to sequentially select a memory device, mark contents of the selected memory device as erased symbols, perform an RS error correction routine on the error correction codeword using the copy of the contents of the selected memory device.

In Example 8, the subject matter of any one of Examples 1-7 can optionally include logic to return the data in response to a successful recovery of the error correction codeword using the copy of the contents of a selected memory device.

In Example 9, the subject matter of any one of Examples 1-8 can optionally include logic to invoke an error routine in response to an unsuccessful recovery of the error correction codeword using the copy of the contents of the selected memory devices.

Example 10 is an electronic device comprising a processor; and memory control logic to receive a read request for data stored in a memory, retrieve the data and at least one associated error correction codeword, wherein the data and an associated error correction codeword is distributed across a plurality of memory devices in memory, apply a first error correction routine to decode the error correction codeword retrieved with the data, and in response to an uncorrectable error in the error correction codeword, apply a second error correction routine to the plurality of devices in memory.

In Example 11, the subject matter of Example 10 can optionally include an arrangement in which the error correction codeword is a Bose-Chaudhuri-Hocquenghem (BCH) error correction code, and at least one memory device comprises a bitwise XOR of the contents of the plurality of memory devices.

In Example 12, the subject matter of any one of Examples 10-11 can optionally include an arrangement in which the second error correction routine comprises logic to sequentially select a memory device, perform a bitwise XOR operation to recover a copy of the contents of the selected memory device, perform an error correction routine on the error correction codeword using the copy of the contents of the selected memory device.

In Example 13, the subject matter of any one of Examples 10-12 can optionally include logic to return the data in response to a successful recovery of the error correction codeword using the copy of the contents of a selected memory device.

In Example 14, the subject matter of any one of Examples 10-13 can optionally include logic to return an error in response to an unsuccessful recovery of the error correction codeword using the copy of the contents of the selected memory devices.

In Example 15, the subject matter of any one of Examples 10-14 can optionally include an arrangement in which the error correction codeword is a Reed-Solomon (RS) error correction code.

In Example 16, the subject matter of any one of Examples 10-15 can optionally include logic to sequentially select a memory device, mark contents of the selected memory device as erased symbols, perform an RS error correction routine on the error correction codeword using the copy of the contents of the selected memory device.

In Example 17, the subject matter of any one of Examples 10-16 can optionally include logic to return the data in response to a successful recovery of the error correction codeword using the copy of the contents of a selected memory device.

In Example 18 the subject matter of any one of Examples 10-17 can optionally include logic to invoke an error routine in response to an unsuccessful recovery of the error correction codeword using the copy of the contents of the selected memory devices.

Example 19 is a method, comprising receiving, in a controller, a read request for data stored in a memory, retrieving the data and at least one associated error correction codeword, wherein the data and an associated error correction codeword is distributed across a plurality of memory devices in memory, applying, in the controller, a first error correction routine to decode the error correction codeword retrieved with the data and in response to an uncorrectable error in the error correction codeword, applying, in the controller, a second error correction routine to the plurality of devices in memory.

In Example 20, the subject matter of Example 19 can optionally include an arrangement in which the error correction codeword is a Bose-Chaudhuri-Hocquenghem (BCH) error correction code, and at least one memory device comprises a bitwise XOR of the contents of the plurality of memory devices.

In Example 21, the subject matter of any one of Examples 19-20 can optionally include an arrangement in which the second error correction routine comprises logic to sequentially select a memory device, perform a bitwise XOR operation to recover a copy of the contents of the selected memory device, perform an error correction routine on the error correction codeword using the copy of the contents of the selected memory device.

In Example 22, the subject matter of any one of Examples 19-21 can optionally include returning the data in response to a successful recovery of the error correction codeword using the copy of the contents of a selected memory device.

In Example 23, the subject matter of any one of Examples 19-22 can optionally include returning an error in response to an unsuccessful recovery of the error correction codeword using the copy of the contents of the selected memory devices.

In Example 24, the subject matter of any one of Examples 19-23 can optionally include an arrangement in which the error correction codeword is a Reed-Solomon (RS) error correction code.

In Example 25, the subject matter of any one of Examples 19-24 can optionally include logic to sequentially select a memory device, mark contents of the selected memory device as erased symbols, perform an RS error correction routine on the error correction codeword using the copy of the contents of the selected memory device.

In Example 26, the subject matter of any one of Examples 19-25 can optionally include logic to return the data in response to a successful recovery of the error correction codeword using the copy of the contents of a selected memory device.

In Example 27, the subject matter of any one of Examples 19-26 can optionally include logic to invoke an error routine in response to an unsuccessful recovery of the error correction codeword using the copy of the contents of the selected memory devices.

In various embodiments of the invention, the operations discussed herein, e.g., with reference to FIGS. 1-10, may be implemented as hardware (e.g., circuitry), software, firmware, microcode, or combinations thereof, which may be provided as a computer program product. e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected." along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A memory controller comprising logic to:
receive a read request for read data stored in a plurality of memory devices, wherein a single error correction codeword is distributed across the plurality of memory devices and is associated with all the read data stored in the plurality of memory devices;
retrieve the read data and the error correction codeword;
apply a first error correction routine to decode the error correction codeword; and
in response to an uncorrectable error in the error correction codeword, apply a second error correction routine to the plurality of memory devices.

2. The memory controller of claim 1, wherein:
the error correction codeword is a Bose-Chaudhuri-Hocquenghem (BCH) error correction code; and
at least one memory device comprises a bitwise XOR of the contents of the plurality of memory devices.

3. The memory controller of claim 2, wherein the second error correction routine comprises logic to sequentially:
select a memory device;
perform a bitwise XOR operation to recover a copy of the contents of the selected memory device; and
perform an error correction routine on the error correction codeword using the copy of the contents of the selected memory device.

4. The memory controller of claim 3, further comprising logic to:
return the read data in response to a successful recovery of the error correction codeword using the copy of the contents of the selected memory device.

5. The memory controller of claim 3, further comprising logic to:
return an error in response to an unsuccessful recovery of the error correction codeword using the copy of the contents of the selected memory device.

6. The memory controller of claim 1, wherein:
the error correction codeword is a Reed-Solomon (RS) error correction code.

7. The memory controller of claim 6, wherein the second error correction routine comprises logic to sequentially:
select a memory device;
mark contents of the selected memory device as erased symbols; and
perform an RS error correction routine on the error correction codeword using the copy of the contents of the selected memory device.

8. The memory controller of claim 7, further comprising logic to:
return the read data in response to a successful recovery of the error correction codeword using the copy of the contents of a selected memory device.

9. The memory controller of claim 8, further comprising logic to:
invoke an error routine in response to an unsuccessful recovery of the error correction codeword using the copy of the contents of the selected memory device.

10. An electronic device comprising:
a processor; and
a memory controller comprising logic to:
receive a read request for read data stored in a plurality of memory devices wherein a single error correction codeword is distributed across the plurality of memory devices and is associated with all the read data stored in the plurality of memory devices;
retrieve the read data and the error correction codeword;
apply a first error correction routine to decode the error correction codeword; and
in response to an uncorrectable error in the error correction codeword, apply a second error correction routine to the plurality of memory devices.

11. The electronic device of claim 10, wherein:
the error correction codeword is a Bose-Chaudhuri-Hocquenghem (BCH) error correction code; and
at least one memory device comprises a bitwise XOR of the contents of the plurality of memory devices.

12. The electronic device of claim 11, wherein the second error correction routine comprises logic to sequentially:
select a memory device;
perform a bitwise XOR operation to recover a copy of the contents of the selected memory device; and
perform an error correction routine on the error correction codeword using the copy of the contents of the selected memory device.

13. The electronic device of claim 12, further comprising logic to:
return the read data in response to a successful recovery of the error correction codeword using the copy of the contents of the selected memory device.

14. The electronic device of claim 12, further comprising logic to:
return an error in response to an unsuccessful recovery of the error correction codeword using the copy of the contents of the selected memory device.

15. The electronic device of claim 10, wherein:
the error correction codeword is a Reed-Solomon (RS) error correction code.

16. The electronic device of claim 15, wherein the second error correction routine comprises logic to sequentially:
select a memory device;
mark contents of the selected memory device as erased symbols; and
perform an RS error correction routine on the error correction codeword using the copy of the contents of the selected memory device.

17. The electronic device of claim 16, further comprising logic to:
return the read data in response to a successful recovery of the error correction codeword using the copy of the contents of a selected memory device.

18. The electronic device of claim 17, further comprising logic to:
invoke an error routine in response to an unsuccessful recovery of the error correction codeword using the copy of the contents of the selected memory device.

19. A method, comprising:
receiving, in a controller, a read request for read data stored in a plurality of memory devices, wherein a single error correction codeword is distributed across the plurality of memory devices and is associated with all the read data stored in the plurality of memory devices;
retrieving the read data and the error correction codeword;
applying, in the controller, a first error correction routine to decode the error correction codeword; and
in response to an uncorrectable error in the error correction codeword, applying, in the controller, a second error correction routine to the plurality of memory devices.

20. The method of claim 19, wherein:
the error correction codeword is a Bose-Chaudhuri-Hocquenghem (BCH) error correction code; and
at least one memory device comprises a bitwise XOR of the contents of the plurality of memory devices.

21. The method of claim 20, wherein the second error correction routine comprises:
selecting a memory device;
performing a bitwise XOR operation to recover a copy of the contents of the selected memory device; and
performing an error correction routine on the error correction codeword using the copy of the contents of the selected memory device.

22. The method of claim 21, further comprising:
returning the read data in response to a successful recovery of the error correction codeword using the copy of the contents of the selected memory device.

23. The method of claim 22, further comprising:
returning an error in response to an unsuccessful recovery of the error correction codeword using the copy of the contents of the selected memory device.

24. The method of claim 19, wherein:
the error correction codeword is a Reed-Solomon (RS) error correction code.

25. The method of claim 24, wherein the second error correction routine comprises:
selecting a memory device;
marking contents of the selected memory device as erased symbols; and
performing an RS error correction routine on the error correction codeword using the copy of the contents of the selected memory device.

* * * * *